United States Patent [19]
Bereza

[11] Patent Number: 5,821,823
[45] Date of Patent: Oct. 13, 1998

[54] VOLTAGE-CONTROLLED OSCILLATOR

[75] Inventor: William Bereza, Nepean, Canada

[73] Assignee: Northern Telecom Limited, Montreal, Canada

[21] Appl. No.: 903,783

[22] Filed: Jul. 31, 1997

[51] Int. Cl.⁶ .................................................. H03B 5/02
[52] U.S. Cl. .............................. 331/57; 331/175; 327/266
[58] Field of Search ....................... 327/538, 266, 327/274, 261; 323/315, 316; 331/57, 175

[56] References Cited

U.S. PATENT DOCUMENTS 5,412,349  5/1995  Young et al. ................................ 331/34

*Primary Examiner*—Robert Pascal
*Assistant Examiner*—Arnold Kinkead
*Attorney, Agent, or Firm*—Angela C. de Wilton

[57] ABSTRACT

A voltage-controlled oscillator (VCO) includes a plurality of differential amplifiers which are ring-connected. Each amplifier includes two FETs, the sources of which are coupled. The coupled sources of each amplifier are connected to series-connected FETs which is part of a current mirror circuit. The series-connected FETs decrease transconductance of (i.e., increase impedance against) fluctuations in a power supply voltage, so that fluctuations in current flowing in the amplifiers are lessened. Thus, power-supply rejection ratio of the VCO increases and fluctuations in the VCO frequency are lessened.

9 Claims, 4 Drawing Sheets

VOLTAGE-CONTROLLED OSCILLATOR

TECHNICAL FIELD

The present invention relates to a voltage-controlled oscillater using a current mirror circuit.

BACKGROUND INFORMATION

A known phase-locked loop (PLL) configuration includes a voltage-controlled oscillator (VCO). The spectral purity at the output of the VCO in a PLL is often compromised due to the noise on power-supply lines. This often over-looked noise results in a component of jitter which can impede the performance of PLLs over other known sources of noise in a multitude of applications particularly modulation schemes for digital radio, clock recovery and synthesis. The ability to suppress supply noise effects in the PLL depends partially on how well the VCO can reject it. A typical VCO includes a ring oscillator and a current mirror circuit which drives the differential amplifiers of the ring oscillator. The overall power-supply rejection (PSR) ratio of the differential amplifier is already high, by nature. Nevertheless, fluctuations in a power supply voltage can cause fluctuations in current flowing in the ring oscillator's amplifiers, resulting in fluctuations in the VCO frequency.

SUMMARY OF THE INVENTION

It is an object of the present invention to provide an improved voltage-controlled oscillator.

According to one aspect of the present invention, there is provided a voltage-controlled oscillator comprising: first and second voltage terminals for receiving first and second voltages, respectively; an input terminal for receiving an input current; n differential amplifiers, each including first and second FETs, the sources of which are coupled together, the drain of each of the first and second FETs being connected to the second voltage terminal through a load element, n being an integer and greater than two, the drains of the first and second FETs of the $i^{th}$ amplifier being connected to the gates of the second and first FETs of the $(i+1)^{th}$ amplifier, the drains of the first and second FETs of the $n^{th}$ amplifier being connected to the gates of the respective FETs of the first amplifier so that the n amplifiers are ring-connected, $1 \leq i < n$; n current means, each including third and fourth FETs connected in series between the first voltage terminal and the coupled sources of the first and second FETs of the respective amplifier, the drain of the third FET being connected to the gate thereof; fifth and sixth FETs connected in series between the input terminal and the second voltage terminal, the drain of the fifth FET being connected to the gate thereof; and seventh, eighth, ninth and tenth FETs connected in series between the first and the second voltage terminals, the drain of each of the eighth and tenth FETs being connected to the gate thereof, the gates of the ninth and tenth FETs being connected to the gates of the fifth and sixth FETs, respectively, the gates of the seventh and eighth FETs being connected to the gates of the third and fourth FETs, respectively, of each current means, respectively. The number n of the differential amplifiers may be odd or even, as long as the number of inversions along the signal path is odd.

In the voltage-controlled oscillator (VCO), the series-connected third and fourth FETs as a whole of each current means decrease transconductance (i.e., increase impedance) against fluctuations in power supply voltage, so that fluctuations in current flowing in the amplifiers are lessened. Thus, power-supply rejection ratio of the VCO increases and fluctuations in the VCO frequency decrease.

BRIEF DESCRIPTION OF THE DRAWINGS

Embodiments of the present invention will now be described by way of example with reference to the accompanying drawings in which.

DETAILED DESCRIPTION

I. Prior Art VCO

Figure 1:
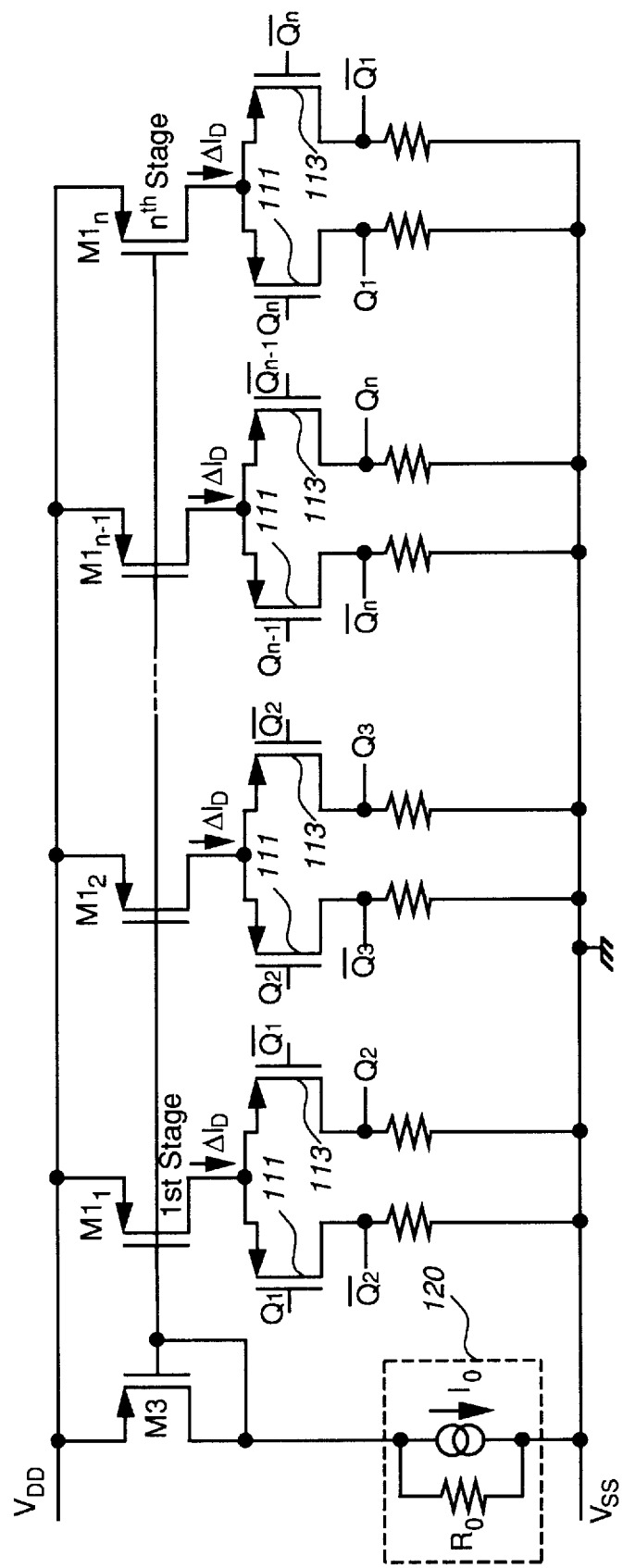
FIG. 1 is a circuit diagram of a prior art VCO.
Figure 2:
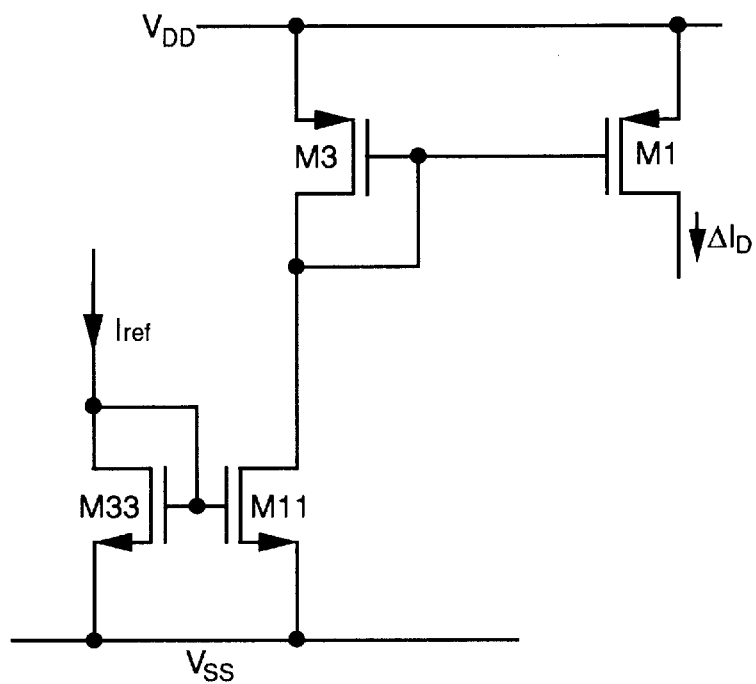
FIG. 2 is a circuit diagram of a current mirror circuit used for the prior art VCO.

FIG. 1 shows a prior art VCO including n differential amplifiers and a current mirror circuit. The VCO is a known ring oscillator and a differential structure that incorporates delay cells in the form of inverters based on the differential transistor pair. Each cell is constituted by each amplifier and each current circuit (one FET) connected thereto. The drains of the first and second FETs 111 and 113 of the $i^{th}$ stage amplifier are connected to the gates of the second and first FETs 113 and 111 of the $(i+1)^{th}$ stage amplifier, respectively, i being $1 \leq i < n$. The drains of the first and second FETs 111 and 113 of the $n^{th}$ stage amplifier are connected to the gates of the first and second FETs 111 and 113 of the first stage amplifier, so that the n amplifiers are ring-connected. The coupled sources of the FETs 111 and 113 of the n -amplifiers are connected to n current circuit FETs $M1_1$, -----, $M1_n$, respectively, the gates of which are connected to the gate of a FET M3. The FETs M3 and $M1_1$, -----, $M1_n$ constitute a current mirror circuit. Current $I_0$ is provided to the current mirror circuit by a current source 120 having an impedance $R_0$. A typical current mirror circuit including the current source 120 is shown in FIG. 2, wherein the current source 120 is constituted by two FETs M11 and M33.

The differential amplifier, by nature, has an overall PSR ratio that is notably quite high. However, any difference in current through the long-tail pair as sourced from fluctuations in a supply voltage $V_{DD}$ causes fluctuations in the VCO frequency, according to its sensitivity with respect to the voltage $V_{DD}$. High PSR ratio is necessary, particularly when prescalars are used in the PLL in which the VCO is included. This is because corrections in the phase occur at large time intervals in relation to the VCO's free-running frequency, thus the VCO must be particularly insensitive to noise on the supply voltage.

The fluctuations of current through the long-tailed pair (causing jitter in the VCO) are a result of two primary mechanisms. These are first, the small-signal variations on internal nodes that transconduct along the signal path and secondly, the finite impedance of active devices (i.e., channel-length modulation in metal oxide semiconductor (MOS) devices).

Limiting the analysis of current fluctuations to frequencies below the poles for the sake of simplicity, it may be demonstrated that the fluctuation $\Delta I_D$ in the current flowing in the coupled sources of each differential amplifier is given by $$\Delta I_D = \Delta I_D{}^{SG} + \Delta I_D{}^{\lambda} \quad (1)$$

where $\Delta I_D{}^{SG}$ is one component of drain current fluctuation in the current of the FET M1 and $\Delta I_D{}^{\lambda}$ is the other component of current fluctuation in the drain current of the FET M1. The current fluctuations $\Delta I_D{}^{SG}$ and $\Delta I_D{}^{\lambda}$ come about from the compression of the source-gate voltage $V_{SG}$ in the current mirror circuit (FETs M3–M1$_1$–M1$_n$) and the effects of channel-length modulation respectively from fluctuations in the voltage $V_{DD}$. It should also be noted that fluctuations on the ground power rail are also responsible for a slight compression effect. Ground is often a much lower impedance than the $V_{DD}$ rail in typical applications. The compression effect is easily calculated for fluctuations in a lower voltage $V_{SS}$ (the ground potential) in the same manner as it will be calculated for the $V_{DD}$ rail. Furthermore, no modulation of current through the differential amplifier takes place from fluctuations in the voltage $V_{SS}$. However, it is possible that any imbalance in the load resistors of the differential amplifier or mismatch in the FETs 111 and 113 may cause a loss of attainable PSR.

Consider first a fluctuation in the voltage $V_{DD}$. Any compression in the quantity $V_{SG3}=V_{SG1}=V_{SG}$ causes a current to flow. It may be shown through small-signal analysis that $$\Delta V_{SG} = ((1/g_{m3})\Delta V_{DD})/(R_0 + 1/g_{m3}) \quad (2)$$

which causes a current fluctuation to flow in the FET M1 such that $$\Delta I_D{}^{SG} = g_{m1}\Delta V_{SG} \quad (3)$$

where $g_{m1}$ and $g_{m3}$ are the transconductance of the FETs M1 and M3, respectively.

From equations (2) and (3), $\Delta I_D{}^{SG}$ is given by $$\Delta I_D{}^{SG} = (g_{m1}(1/g_{m3})\Delta V_{DD})/(R_0 + 1/g_{m3}) \quad (4)$$

At first glance, it would be desirable to reduce the value of $1/g_{m3}$ to minimize the compression effect. However, as is often the case with matched current mirror circuits, the above expression reduces to $$\Delta I_D{}^{SG} = \Delta V_{DD}/(R_0 + 1/g_{m3}) \quad (5)$$

if $g_{m1}=g_{m3}$. Clearly, it can be seen that in order to keep $\Delta V_{SG}$ (and thus $\Delta I_D{}^{SG}$) as small as possible, making the quantity $1/g_{m3}$ smaller would increase the amount of AC current, albeit negligible as it is. It is better to increase the PSR ratio by increasing the output impedance of the current source 120. As the current source 120 is usually realized through the use of another current mirror circuit, well known techniques may be utilized to accomplish this point monolithically.

A secondary source of tail current fluctuations $\Delta I_D$ comes from fluctuations in the source-drain voltage $V_{SD}$ in the FET M1. Because of the low impedance seen at the sources of the driving FETs within the differential pair, $\Delta V_{SD1}$ is for all intents and purposes the same magnitude as $\Delta V_{DD}$. Thus, depending on the length of the device, channel-length modulation can produce a significant component in the overall $\Delta I_D$. It may easily be shown that an AC component (i.e., a fluctuation) of current flows from excursions of $\Delta V_{SD}$ based on the square-law current equation such that $$\Delta I_D{}^{\lambda} = I_{D1}(\lambda \times \Delta V_{SD1}) = \Delta V_{SD1}/r_{o1} \quad (6)$$

where $\lambda$ is the channel-length modulation parameter and $r_{o1}$ is the impedance of the FET M1. Simulations may be performed on the basic current mirror circuit which assumes an infinitely high impedance $R_0$ around the current source 120 so that the only AC component of current that flows is from channel-length modulation effects. Analysis shows that the zero and pole are directly related to the Miller capacitance on the FET M1 (i.e., the gate-drain capacitance $C_{gd}$) where the frequency of the zero also depends upon the output impedance of the FET M1. Thus, in order to obtain a better low-frequency PSR ratio of the current mirror circuit, it is necessary to increase its output impedance. This amounts to a reduction of $\Delta V_{SD1}$ on the FET M1 here resulting in less AC current generation from this effect.

It is simply the AC current that flows, for example, in the FET M1 here, as a result of fluctuations in the voltage $V_{DD}$. There are two components that are responsible for the characteristics seen and may be defined as follows:

$$g_m{}^{SG} = \partial I_D{}^{SG}/\partial V_{DD} \quad (7)$$

where $g_m{}^{SG}$ is the power rail transconductance associated with the compression effect of the source-gate voltage of the current mirror circuit. $I_D{}^{SG}$ is source-drain current as a result of the voltage fluctuation $\Delta V_{SG}$. The power rail transconductance that comes about from the channel-length modulation effect is $$g_m{}^{\lambda} = \partial I_D{}^{\lambda}/\partial V_{DD} \quad (8)$$

where $I_D{}^{\lambda}$ is source-drain current as a result of the voltage fluctuation $\Delta V_{SD}$.

It is easy to see that the resulting power rail transconductances would be, for the conventional circuit of FIG. 1, $$g_m{}^{SG}(M1) = (g_{m1}/g_{m3})/(R_0 + 1/g_{m3}) \approx (g_{m1}/g_{m3})/R_0 \quad (9)$$

$$g_m{}^{\lambda}(M1) = 1/r_{o1} \quad (10)$$

It can be shown that the zero associated with the power rail transconductance of the FET M1 (i.e., the AC current that flows in the FET M1 as a result of fluctuations in the voltage $V_{DD}$) is directly influenced by the output impedance of the current mirror circuit.

II. Embodiment VCO

Figure 3:
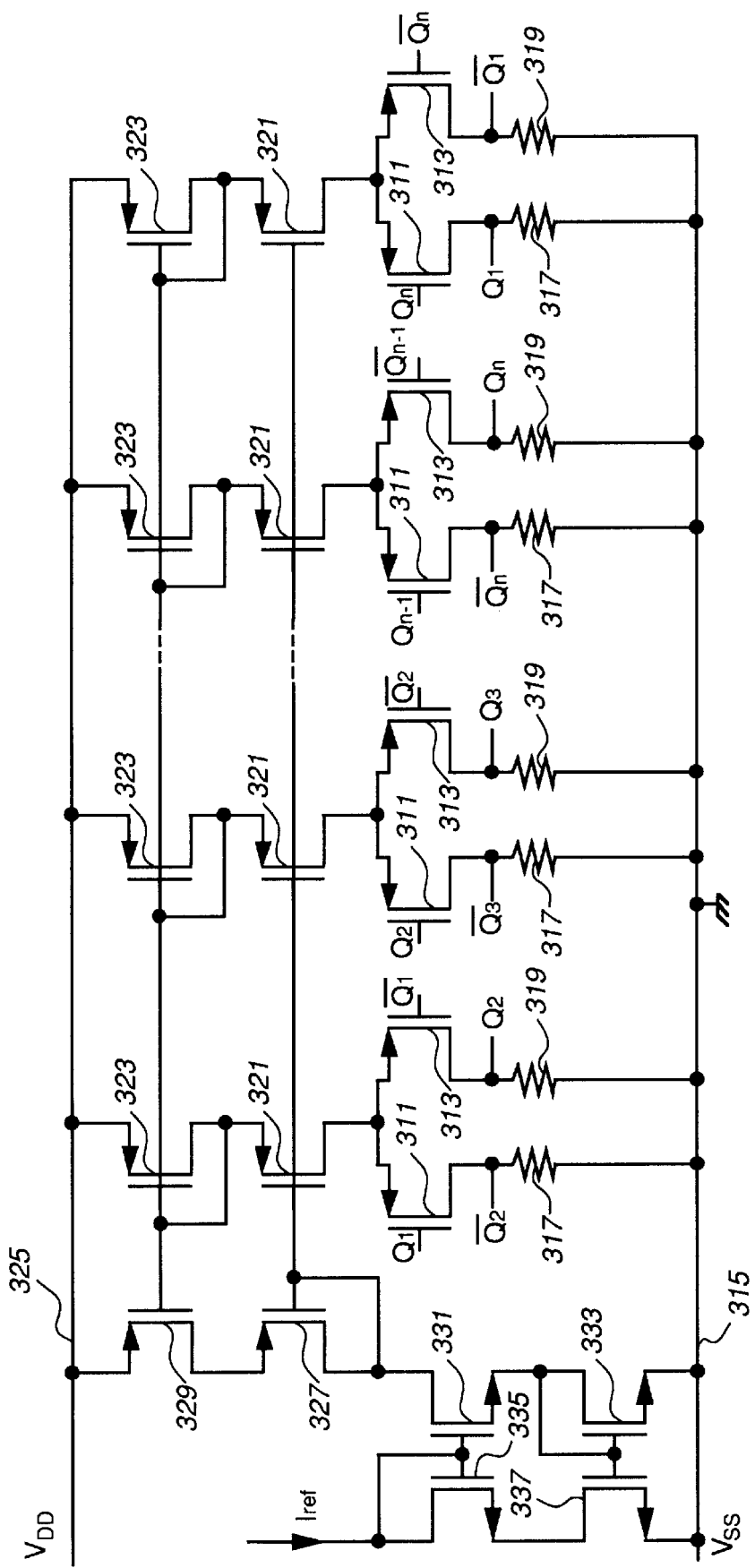
FIG. 3 is a circuit diagram of a VCO according to an embodiment of the present invention.

FIG. 3 shows a VCO according to an embodiment of the present invention. The VCO includes n differential amplifiers and a current mirror circuit. Each of the differential amplifiers includes first and second P-channel FETs 311 and 313, the sources of which are coupled together. The drains of the FETs 311 and 313 are connected to a lower voltage terminal 315 of voltage $V_{SS}$ via resistors 317 and 319, respectively. The terminal 315 is connected to the ground terminal. The drains of the first and second FETs 311 and 313 of the first amplifier are connected to the gates of the second and first FETs 313 and 311 of the second amplifier. Similarly, the drains of the first and second FETs 311 and 313 of the second amplifier are connected to the gates of the second and first FETs 313 and 311 of the next stage amplifier. The drains of the first and second FETs 311 and 313 of the nth amplifier are connected to the gates of the first and second FETs 311 and 313 of the first amplifier so that the n amplifiers are ring-connected.

The coupled sources of the two FETs 311 and 313 of each amplifier are connected to the drain of a respective P-channel FET 321, the source of which is connected to the drain of a P-channel FET 323. The sources of the n FETs 323 are connected to the voltage terminal 325 of a supply voltage $V_{DD}$. The gates of the n FETs 321 are connected to the gate of a P-channel FET 327. The drain and gate of each of the FETs 323 are connected to the gate of a P-channel FET 329.

The source and the drain of the FET 329 are connected to the voltage terminal 325 and the source of the FET 327, respectively. The drain of the FET 327 is connected to the drain of an N-channel FET 331, the source of which is connected to the drain and gate of an N-channel FET 333. The gate of the FET 331 is connected to the gate and drain of an N-channel FET 335, the source of which is connected to the drain of an N-channel FET 337. The gate and the source of the FET 337 are connected to the gate of the FET 333 and the ground terminal 315, respectively. The drain of the FET 335 receives reference current Iref from a source (not shown). Each amplifier and the respective series-connected FETs 321 and 323 constitute a delay cell. The delay cells are in the form of inverters based on the differential pair.

The FETs 327–335 and each series-connected FETs 321 and 323 constitute a current mirror circuit. Each of the differential FET pairs which are ring-connected has an identical structure of one shown in FIG. 1. A current circuit connected to the coupled sources of each differential amplifier is constituted by the series-connected FETs 321 and 323. The series-connected FETs in conjunction with the other FETs in the mirror circuit provide decreased transconductances and increased impedance with respect to the AC components in the voltages $V_{DD}$ and $V_{SS}$.

The power rail transconductances $g_m^\lambda$ and $g_m^{SG}$ of the series-connected FETs 321 and 323 are defined as follows, for the improved VCO of FIG. 3:

$$g_m^\lambda = 1/[r_{o1}(g_{m3}r_{o3})] \qquad (11)$$

$$g_m^{SG} = (g_{m2}/g_{m3})/(r_{o11}g_{m33}r_{o33}) \qquad (12)$$

where $r_{o1}$, $r_{o3}$, $r_{o11}$ and $r_{o33}$ are the impedances of the FETs 321, 329, 331 and 337, respectively, and $g_{m2}$, $g_{m3}$ and $g_{m33}$ are the transconductance of the FETs 323, 329 and 337, respectively.

Comparing (11) and (12) to (10) and (9), respectively, the power transconductances $g_m^\lambda$ and $g_m^{SG}$ are decreased and the impedance is increased, in comparison with the circuit shown in FIGS. 1 and 2. Because of the increased impedance, the PSR ratio is improved, resulting in less fluctuations on the VCO frequency.

Figure 4:
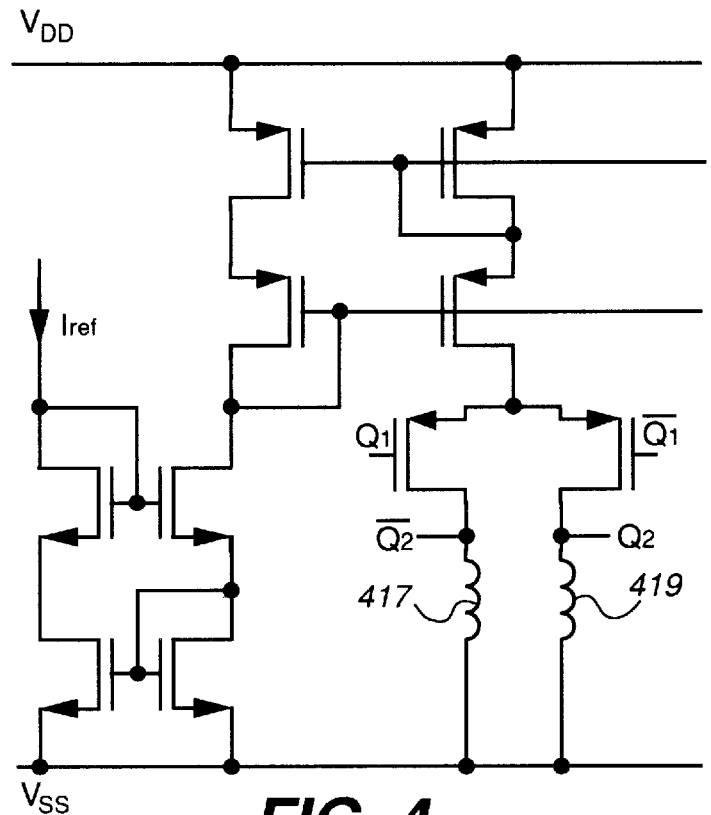
FIG. 4 is a circuit diagram of a differential amplifier and a current mirror circuit included in a VCO according to another embodiment of the present invention.

FIG. 4 shows a differential amplifier and a current mirror circuit included in a VCO according to another embodiment of the present invention. In FIG. 4, the source coupled FETs of the differential amplifier are connected to inductors 417 and 419 which are load elements.

Figure 5:
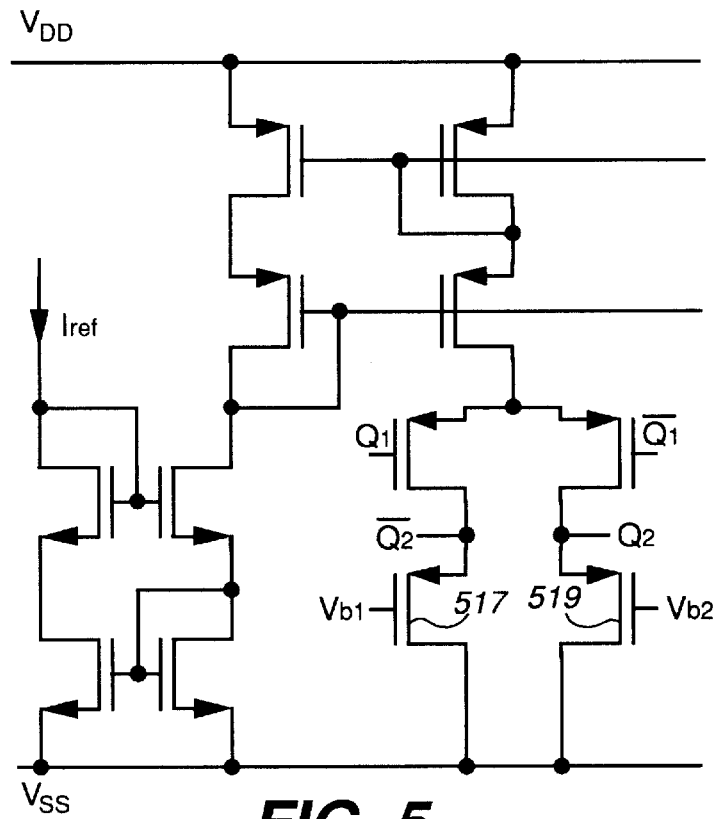
FIG. 5 is a circuit diagram of a differential amplifier and a current mirror circuit included in a VCO according to another embodiment of the present invention.

FIG. 5 shows a differential amplifier and a current mirror circuit included in a VCO according to another embodiment of the present invention. In FIG. 5, the source coupled FETs of the differential amplifier are connected to FETs 517 and 519 which are load elements. Control voltages $V_{b1}$ and $V_{b2}$ are fed to the gates of the FETs 517 and 519 which are operated as dynamic resistors.

Although particular embodiments of the present invention have been described in detail, it should be appreciated that numerous variations, modifications, and adaptations may be made without departing from the scope of the present invention as defined in the claims. For example, the channel types of the FETs may inverse and load elements may be other active circuit elements or a combination of any kinds of dynamic and/or static elements.

What is claimed is:

1. A voltage-controlled oscillator comprising:

first and second voltage terminals for receiving first and second voltages, respectively;

an input terminal for receiving an input current;

n differential amplifiers, each including first and second FETs, the sources of which are coupled together, the drain of each of the first and second FETs being connected to the second voltage terminal through a load element, n being an integer and greater than two, the drains of the first and second FETs of the $i^{th}$ amplifier being connected to the gates of the second and first FETs of the $(i+1)^{th}$ amplifier, the drains of the first and second FETs of the nth amplifier being connected to the gates of the respective FETs of the first amplifier so that the n amplifiers are ring-connected, $1 \leq i \leq n$;

n current means, each including third and fourth FETs connected in series between the first voltage terminal and the coupled sources of the first and second FETs of the respective amplifier, the drain of the third FET being connected to the gate thereof;

fifth and sixth FETs connected in series between the input terminal and the second voltage terminal, the drain of the fifth FET being connected to the gate thereof; and seventh, eighth, ninth and tenth FETs connected in series between the first and the second voltage terminals, the drain of each of the eighth and tenth FETs being connected to the gate thereof, the gates of the ninth and tenth FETs being connected to the gates of the fifth and sixth FETs, respectively, the gates of the seventh and eighth FETs being connected to the gates of the third and fourth FETs, respectively, of each current means, respectively wherein the first, second, third, fourth, seventh and eighth FETs are first channel type FETs and the fifth, sixth, ninth and tenth FETs are second channel type FETs.

2. The voltage-controlled oscillator of claim 1, the drains of the first and second FETs of the $n^{th}$ amplifier are connected to the gates of the first and second FETs of the first amplifier, respectively.

3. The voltage-controlled oscillator of claim 1, wherein the first and second channel types are P and N-channel types, respectively.

4. The voltage-controlled oscillator of claim 1, wherein the load element is an impedance element.

5. The voltage-controlled oscillator of claim 4, wherein the impedance element is a resistance element.

6. The voltage-controlled oscillator of claim 4, wherein the impedance element is an inductor.

7. The voltage-controlled oscillator of claim 5, wherein the resistance element is a resistor.

8. The voltage-controlled oscillator of claim 5, wherein the resistance element is a dynamic resistance element.

9. The voltage-controlled oscillator of claim 5, wherein the dynamic resistance element is a transistor.

* * * * *